United States Patent
Besling et al.

(10) Patent No.: US 12,180,066 B2
(45) Date of Patent: Dec. 31, 2024

(54) SENSOR PACKAGE AND METHOD OF PRODUCING THE SENSOR PACKAGE

(71) Applicant: Sciosense B.V., AE Eindhoven (NL)

(72) Inventors: Willem Frederik Adrianus Besling, JN Eindhoven (NL); Casper Van Der Avoort, Waalre (NL); Coenraad Cornelis Tak, Waalre (NL); Remco Henricus Wilhelmus Pijnenburg, Hoogeloon (NL); Olaf Wunnicke, AE Eindhoven (NL); Hendrik Bouman, Nijmegen (NL)

(73) Assignee: Sciosense B.V., AE Eindhoven (NL)

( * ) Notice: Subject to any disclaimer, the term of this patent is extended or adjusted under 35 U.S.C. 154(b) by 631 days.

(21) Appl. No.: 17/228,248

(22) Filed: Apr. 12, 2021

(65) Prior Publication Data
US 2021/0229981 A1    Jul. 29, 2021

Related U.S. Application Data

(62) Division of application No. 16/312,002, filed as application No. PCT/EP2017/064623 on Jun. 14, 2017, now Pat. No. 11,001,495.

(30) Foreign Application Priority Data

Jun. 21, 2016 (EP) ................................. 16175474

(51) Int. Cl.
*B81B 7/00* (2006.01)
*B81C 1/00* (2006.01)
*G01D 11/24* (2006.01)

(52) U.S. Cl.
CPC .......... *B81B 7/0048* (2013.01); *B81C 1/0023* (2013.01); *G01D 11/245* (2013.01); *B81B 2201/0264* (2013.01); *B81B 2207/015* (2013.01); *B81B 2207/07* (2013.01); *B81C 2203/032* (2013.01); *B81C 2203/0785* (2013.01)

(58) Field of Classification Search
None
See application file for complete search history.

(56) References Cited

U.S. PATENT DOCUMENTS

| | | |
|---|---|---|
| 5,604,363 A | 2/1997 | Ichihashi |
| 7,568,390 B2 | 8/2009 | Shizuno |
| 8,643,127 B2 | 2/2014 | Dangtran et al. |
| 9,061,454 B2 | 6/2015 | De Volder et al. |
| 9,372,110 B2 | 6/2016 | Cornu et al. |
| 9,691,687 B2 | 6/2017 | Kehrer et al. |
| 10,192,842 B2 | 1/2019 | Bouman et al. |

(Continued)

FOREIGN PATENT DOCUMENTS

| | | |
|---|---|---|
| CN | 1710427 A | 12/2005 |
| CN | 101010807 A | 8/2007 |

(Continued)

*Primary Examiner* — Daniel Whalen
(74) *Attorney, Agent, or Firm* — Slater Matsil, LLP

(57) ABSTRACT

A sensor package and a method for producing a sensor package are disclosed. In an embodiment a method for producing a sensor package includes providing a carrier including electric conductors, fastening a dummy die or interposer to the carrier, providing an ASIC device including an integrated sensor element and fastening the ASIC device to the dummy die or interposer.

16 Claims, 2 Drawing Sheets

(56) References Cited

U.S. PATENT DOCUMENTS

| | | |
|---|---|---|
| 10,743,112 B2 * | 8/2020 | Besling .................. H01L 24/16 |
| 2005/0146000 A1 | 7/2005 | Kim et al. |
| 2005/0194685 A1 * | 9/2005 | Weiblen ................ G01L 19/141 |
| | | 257/738 |
| 2006/0012018 A1 * | 1/2006 | Karnezos ............ H01L 25/0652 |
| | | 257/E25.011 |
| 2008/0173097 A1 | 7/2008 | Bauer et al. |
| 2009/0197584 A1 | 8/2009 | Snow et al. |
| 2012/0299170 A1 | 3/2012 | Kehrer |
| 2012/0130671 A1 | 5/2012 | Horning et al. |
| 2014/0090485 A1 | 4/2014 | Feyh et al. |
| 2014/0116122 A1 | 5/2014 | Lammel et al. |
| 2014/0332983 A1 * | 11/2014 | Ho ...................... H01L 29/0657 |
| | | 438/126 |
| 2015/0108653 A1 | 4/2015 | Hooper et al. |
| 2015/0115474 A1 * | 4/2015 | Pham .................. H01L 25/0657 |
| | | 438/109 |
| 2016/0229689 A1 | 8/2016 | Kaanta et al. |
| 2017/0197823 A1 * | 7/2017 | Wachtler ............... B81B 7/0048 |
| 2019/0057940 A1 * | 2/2019 | Cheah .................... H01L 25/50 |

FOREIGN PATENT DOCUMENTS

| | | |
|---|---|---|
| CN | 101124842 A | 2/2008 |
| CN | 102132136 A | 7/2011 |
| CN | 102171536 A | 8/2011 |
| CN | 102800660 A | 11/2012 |
| CN | 203203674 U | 9/2013 |
| CN | 104716115 A | 6/2015 |
| EP | 2455329 A2 | 5/2012 |
| WO | 2002048668 A2 | 6/2002 |

\* cited by examiner

SENSOR PACKAGE AND METHOD OF PRODUCING THE SENSOR PACKAGE

CROSS-REFERENCE TO RELATED APPLICATIONS

This is a divisional application of U.S. application Ser. No. 16/312,002, entitled "Sensor Package and Method of Producing the Sensor Package," which was filed on Dec. 20, 2018, which is a national phase filing under section 371 of PCT/EP2017/064623, filed Jun. 14, 2017, which claims the priority of European patent application 16175474.2, filed Jun. 21, 2016, all of which are incorporated herein by reference in its entirety.

BACKGROUND

Many integrated sensor devices such as pressure sensors, Hall sensors, gyroscopes or inertial sensors are generally highly susceptible to the influence of stress, which can worsen the performance and even damage fragile sensor structures. This problem is aggravated in the case of pressure sensors, which require direct access to the environment.

WO 2002/048668 A2 discloses an integrated CMOS capacitive pressure sensor.

US 2014/0090485 A1 discloses a MEMS pressure sensor assembly comprising a first die assembly including a MEMS pressure sensor and a second die assembly including an ASIC configured to generate an electrical output corresponding to a pressure sensed by the MEMS pressure sensor. A conducting member is positioned between the first die assembly and the second die assembly and electrically connects the MEMS pressure sensor and the ASIC.

SUMMARY

The sensor package comprises a carrier including electric conductors and an ASIC device with an integrated sensor element. A dummy die or interposer is arranged between the carrier and the ASIC device and is fastened to the carrier. In particular, the dummy die or interposer may include an electrically inactive semiconductor substrate, or it may comprise an insulator, especially a glass. The ASIC device is fastened to the dummy die or interposer.

In an embodiment of the sensor package, an adhesive layer comprising silicone is arranged between the dummy die or interposer and the ASIC device. In particular, the adhesive layer may be at least 80 μm thick.

A further embodiment comprises a cover with an opening. The dummy die or interposer and the ASIC device are arranged between the carrier and the cover.

In a further embodiment the sensor element is a pressure sensor.

In a further embodiment the sensor element is sensitive to stress.

In a further embodiment the dummy die or interposer has smaller lateral dimensions than the ASIC device.

In a further embodiment the ASIC device laterally overhangs the dummy die or interposer at least on one side by at least 100 μm.

A further embodiment comprises a bond layer, which comprises a die attach foil and is arranged between the carrier and the dummy die or interposer.

The method of producing a sensor package comprises providing a carrier including electric conductors, fastening a dummy die or interposer on the carrier, providing an ASIC device comprising an integrated sensor element, and fastening the ASIC device to the dummy die or interposer.

In a variant of the method, the ASIC device is fastened to the dummy die or interposer by an adhesive layer, which may especially comprise silicone. In particular, the adhesive layer may be formed at least 80 μm thick.

In a further variant of the method, the dummy die or interposer (4) is fastened to the carrier by a bond layer comprising a die attach foil.

BRIEF DESCRIPTION OF THE DRAWINGS

The following is a detailed description of examples of the sensor package and the method of production in conjunction with the appended figures.

DETAILED DESCRIPTION OF ILLUSTRATIVE EMBODIMENTS

Figure 1:
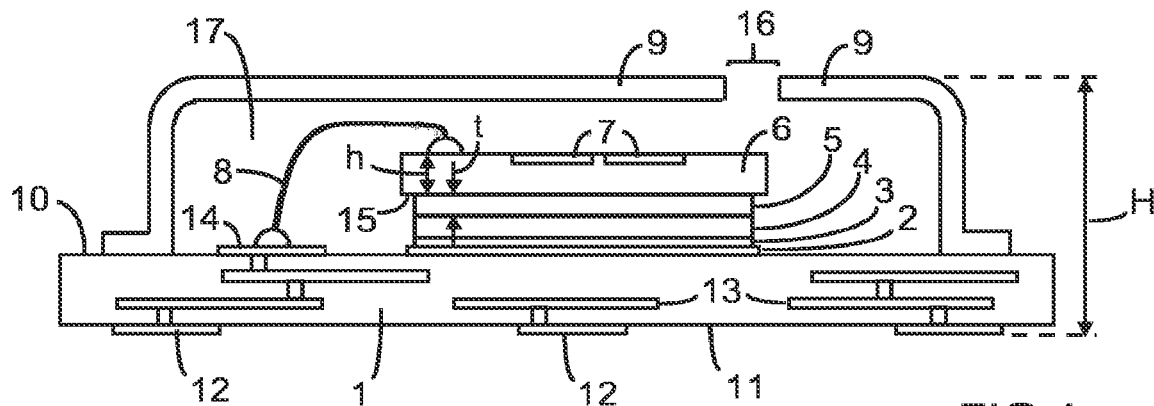
FIG. 1 is a cross section of a sensor package comprising a dummy die or interposer.

FIG. 1 is a cross section of a sensor package comprising a carrier 1 with integrated electric conductors 13, a bottom pad 2 on or above a top surface 10 of the carrier 1, a bond layer 3 on the bottom pad 2, a dummy die or interposer 4 on the bond layer 3, an adhesive layer 5 on the dummy die or interposer 4, an ASIC device 6 with integrated sensor elements 7 on the adhesive layer 5, electric interconnections 8 between the ASIC device 6 and contact pads 14 on the top surface 10 of the carrier 1, a cover 9 on the top surface 10, and terminal contacts 12 on the rear surface 11 of the carrier 1, opposite the top surface 10. The dummy die or interposer 4 provides a mechanical decoupling of the ASIC device 6 from the carrier 1. Deformations that may be caused by external forces acting on the sensor package may thus be prevented from adversely affecting the sensor element 7 integrated in the ASIC device 6.

The carrier 1 may be a printed circuit board, for instance, in particular a laminate. The terminal contacts 12 on the rear surface 11 of the carrier 1 may be formed in the shape of a land grid array, for instance. The integrated electric conductors 13 may provide a wiring or redistribution. The dummy die or interposer 4 may comprise semiconductor material, which may in particular be silicon, and may especially include an electrically inactive semiconductor substrate. The dummy die or interposer 4 may instead comprise an insulator or glass, for instance. The coefficient of thermal expansion of the insulator or glass may in particular be adapted to the coefficient of thermal expansion of the ASIC device 6.

The bottom pad 2 is optional. The bond layer 3 may be a die attach foil, for instance.

The adhesive layer 5 may especially comprise silicone, i. e. a compound obtained by polymerizing siloxane. The silicone may be applied like a glue to fasten the ASIC device 6 to the dummy die or interposer 4. The thickness t of the adhesive layer 5 is larger than 60 μm, typically at least 80 μm for an effective mechanical decoupling between the ASIC device 6 and the dummy die or interposer 4.

The ASIC device 6 may be a CMOS device, for instance. The sensor element 7 may be any conventional sensor, especially a pressure sensor or array of pressure sensors, which may be realized as a microelectromechanical system, for instance. The sensor element 7 may also comprise a sensor sensitive to stress. The mechanical decoupling of the ASIC device 6 from the carrier 1 is improved if the dummy die or interposer 4 has smaller lateral dimensions than the ASIC device 6, so that a lateral overhang 15 is formed at least on one lateral side or edge of the ASIC device 6. The overhang 15 may be considerably larger than the overhang 15 shown in FIG. 1.

The electric interconnections 8 between the ASIC device 6 and contact pads 14 on the top surface 10 of the carrier 1 may be bond wires, for instance, as shown in FIG. 1. The stack of the dummy die or interposer 4 and the ASIC device 6 is accommodated in a cavity 17, which is formed by the carrier 1 and the cover 9. The electric interconnections 8 and the contact pads 14 are also inside the cavity 17. The cover 9 may comprise a metal lid. If the sensor element 7 is a pressure sensor requiring access to the environment, an opening 16 is provided in the cover 9.

Typically the thickness of the carrier 1 may be in the range from 130 μm to 170 μm, the thickness of the bond layer 3 about 20 μm, the thickness of the dummy die or interposer 4 in the range from 50 μm to 200 μm, the thickness of the adhesive layer 5 in the range from 60 μm to more than 100 μm, the height h of the ASIC device 6 in the range from 140 μm to 400 μm, and the overall height H of the sensor package, including the cover 9, in the range from 600 μm to 1100 μm.

Figure 2:
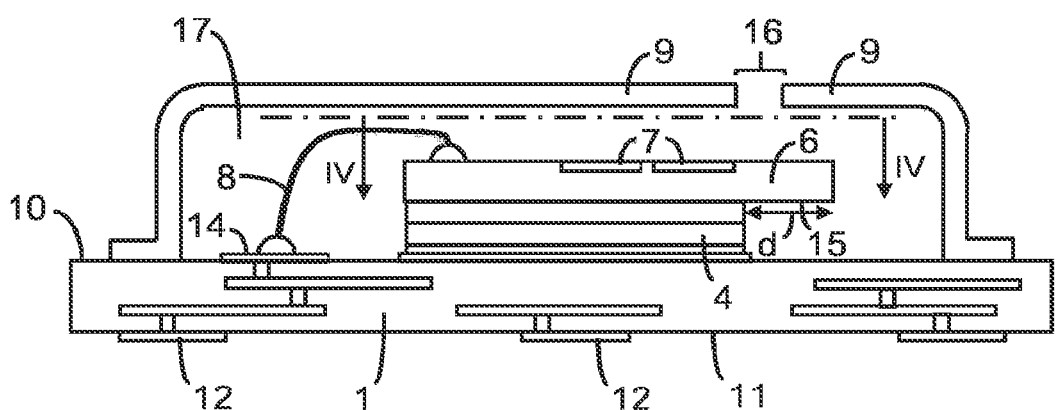
FIG. 2 is a cross section of a further sensor package comprising a dummy die or interposer and an overhanging ASIC device.

FIG. 2 is a cross section of a further sensor package comprising a dummy die or interposer 4. Elements of the sensor package according to FIG. 2 that are similar to corresponding elements of the sensor package according to FIG. 1 are designated with the same reference numerals. In the sensor package according to FIG. 2, the lateral overhang 15 of the ASIC device 6 over the dummy die or interposer 4 is larger than in the sensor package according to FIG. 1, in order to improve the mechanical decoupling. In particular, the overhang 15 may be larger on two or three adjoining lateral sides or edges of the ASIC device 6, the shape of such an arrangement resembling the mushroom called turkey tail (*Trametes versicolor*). The indicated dimension d of the overhang 15 may be typically larger than 50 μm or even larger than 100 μm.

Figure 3:
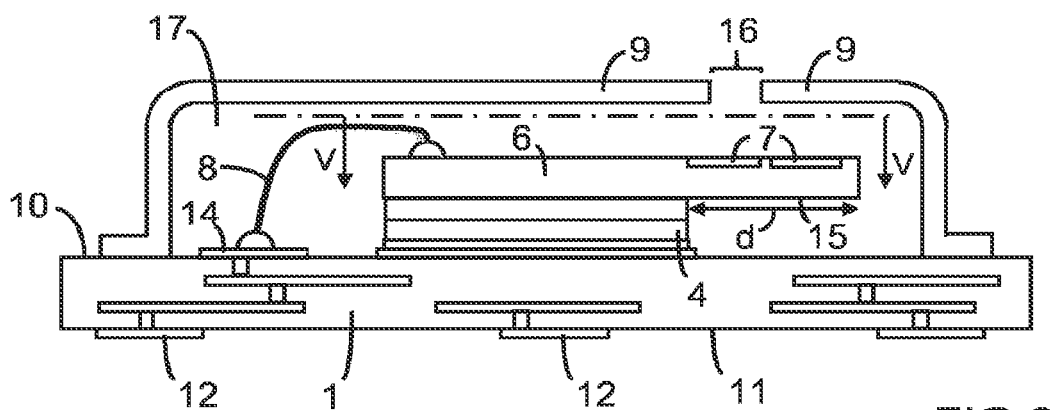
FIG. 3 is a cross section of a further sensor package comprising a dummy die or interposer and an ASIC device with larger overhang.

FIG. 3 is a cross section of a further sensor package comprising a dummy die or interposer 4. Elements of the sensor package according to FIG. 3 that are similar to corresponding elements of the sensor package according to FIG. 1 are designated with the same reference numerals. In the sensor package according to FIG. 3, the lateral overhang 15 of the ASIC device 6 over the dummy die or interposer 4 is even larger than in the sensor package according to FIG. 2. The overhang 15 may be present on one lateral side or edge or on two or three adjoining lateral sides or edges. The larger overhang 15 allows the sensor element 7 to be shifted from the region of the ASIC device 6 that is supported by the dummy die or interposer 4 towards the region of the overhang 15, in order to enhance the mechanical decoupling of the sensor element 7. The dimension d of the overhang 15 indicated in FIG. 3 may be typically larger than 100 μm.

Figure 4:
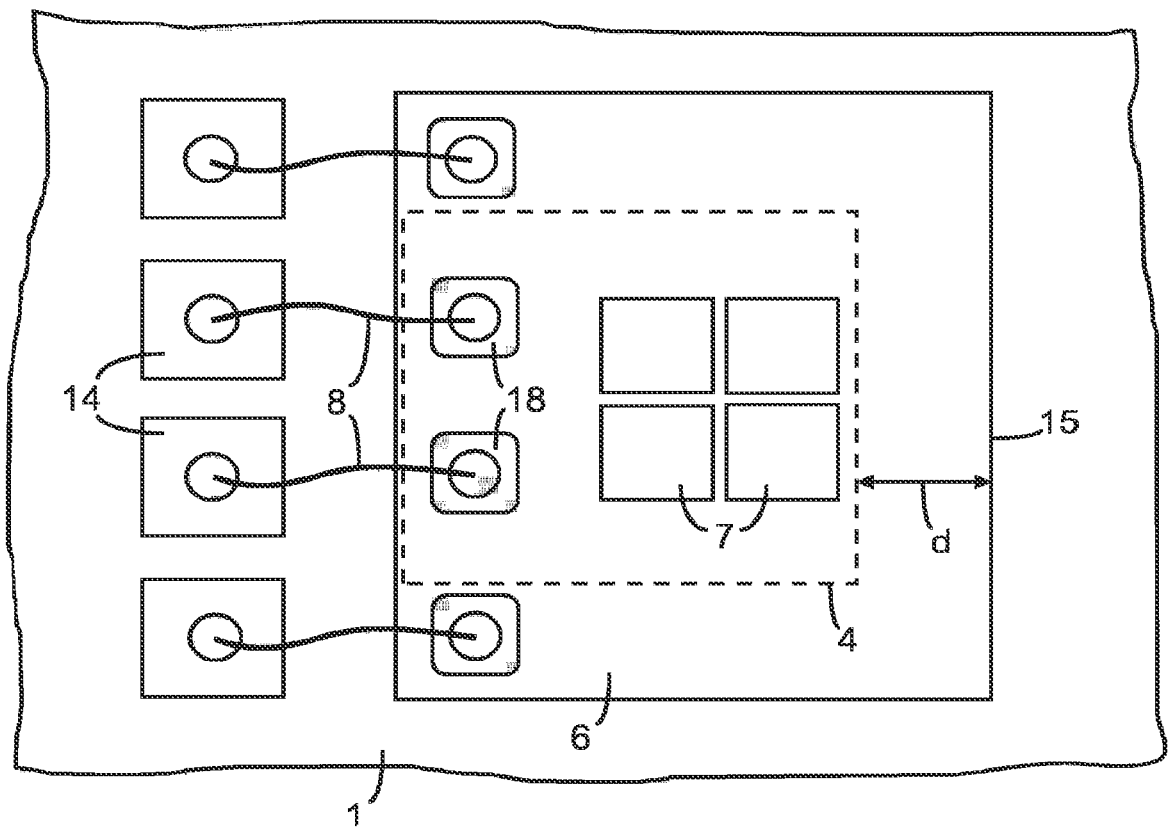
FIG. 4 is a top view corresponding to the indication in FIG. 2.

FIG. 4 is a top view onto the stack of the dummy die or interposer 4 and the ASIC device 6 of the sensor package according to FIG. 2, corresponding to the indication "IV" with arrows pointing down in FIG. 2. The hidden contours of the dummy die or interposer 4, which is covered by the ASIC device 6, are represented in FIG. 4 with broken lines. Contact areas 18 of the ASIC device 6, which may be contact pads or uncovered surface areas of an uppermost metallization level of a wiring, for instance, are electrically connected to the contact pads 14 by interconnections 8, which are bond wires in this example. The number and the arrangement of the contact pads 14 and contact areas 18 can be varied according to individual requirements. The sensor element 7 may be arranged at or near the center of the ASIC device 6, as shown in FIG. 4 by way of example, or near the periphery of the ASIC device 6. FIG. 4 shows a typical "turkey tail" configuration with the large overhang 15 extending on three adjoining lateral sides or edges of the ASIC device 6. Instead, the large overhang 15 may only be present on two adjoining lateral sides or edges of the ASIC device 6.

Figure 5:
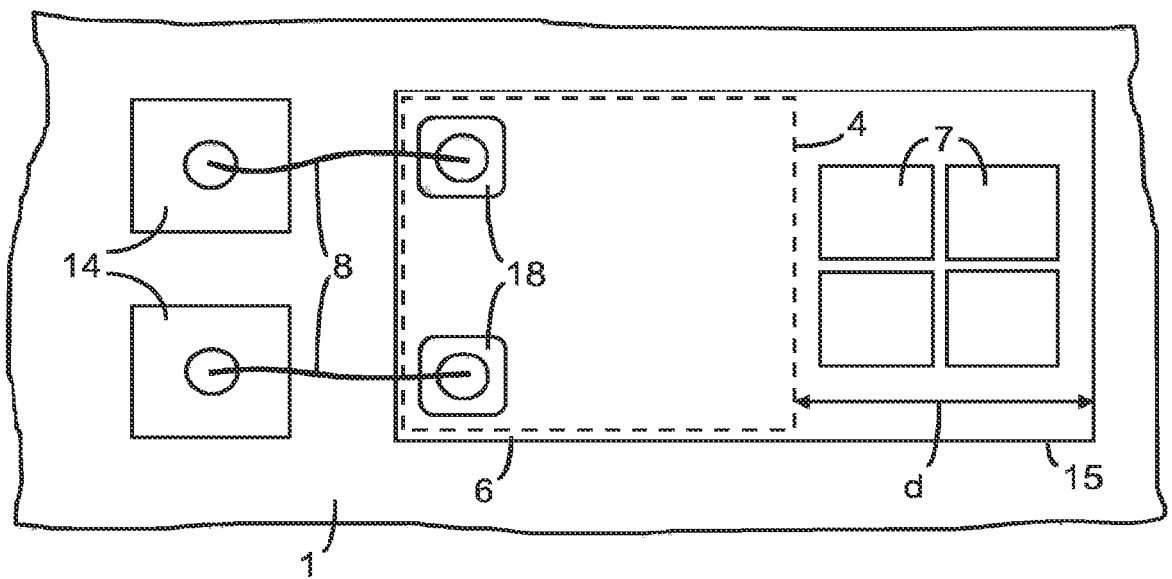
FIG. 5 is a top view corresponding to the indication in FIG. 3.

FIG. 5 is a top view onto the stack of the dummy die or interposer 4 and the ASIC device 6 of the sensor package according to FIG. 3, corresponding to the indication "V" with arrows pointing down in FIG. 3. The hidden contours of the dummy die or interposer 4, which is covered by the ASIC device 6, are represented in FIG. 5 with broken lines. Contact areas 18 of the ASIC device 6, which may be contact pads or uncovered surface areas of an uppermost metallization level of a wiring, for instance, are electrically connected to the contact pads 14 by interconnections 8, which are bond wires in this example. The number and the arrangement of the contact pads 14 and contact areas 18 can be varied according to individual requirements. The sensor element 7 is arranged in the area of the overhang 15. FIG. 5 shows a "diving board" configuration with a large overhang 15 only on one lateral side or edge of the ASIC device 6. Instead, the large overhang 15 may be present on two or three adjoining lateral sides or edges of the ASIC device 6, as in the example shown in FIG. 4.

The sensor package is especially favorable for stress sensitive sensors. The sensor element and the circuitry are integrated on a single die, which allows to reduce the overall height of the sensor package substantially. At the same time stress decoupling is enhanced by the electrically inactive dummy die or interposer. Stress caused by thermal expansion is prevented if the coefficient of thermal expansion of the dummy die or interposer is adapted to the coefficient of thermal expansion of the ASIC device, in particular if the dummy die or interposer comprises the same semiconductor material and hence the same coefficient of thermal expansion as the ASIC device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for producing a sensor package, the method comprising:
   providing a carrier including electric conductors;
   fastening a dummy die or an interposer to the carrier;
   providing an application specific integrated circuit (ASIC) device comprising an integrated sensor element; and
   fastening the ASIC device to the dummy die or the interposer, wherein the dummy die or the interposer is unstructured and electrically inactive, wherein the ASIC device is fastened to the dummy die or the interposer by an adhesive layer, wherein the ASIC device laterally overhangs the dummy die or the interposer, wherein the sensor element is arranged on a portion of the ASIC device that laterally overhangs the dummy die or the interposer, wherein the adhesive layer directly adjoins the ASIC device, and wherein the adhesive layer directly adjoins the dummy die or the interposer.

2. The method according to claim 1, wherein the adhesive layer comprises silicone.

3. The method according to claim 1, wherein the adhesive layer is formed at least 80 μm thick.

4. The method according to claim 1, wherein the dummy die or the interposer is fastened to the carrier by a bond layer comprising a die attach foil.

5. The method according to claim 1, wherein a coefficient of thermal expansion of the dummy die or the interposer is adapted to a coefficient of thermal expansion of the ASIC device.

6. The method according to claim 1, further comprising providing a cover with an opening, wherein the dummy die or the interposer and the ASIC device are arranged between the carrier and the cover.

7. The method according to claim 1, wherein the dummy die or the interposer includes an electrically inactive semiconductor substrate.

8. The method according to claim 1, wherein the dummy die or the interposer comprises an insulator or glass.

9. The method according to claim 1, wherein the dummy die or the interposer has smaller lateral dimensions than the ASIC device so that a lateral overhang is formed on at least one lateral side of the ASIC device.

10. The method according to claim 1, wherein the dummy die or the interposer has smaller lateral dimensions than the ASIC device so that a lateral overhang is formed on at least two lateral sides of the ASIC device.

11. A method for producing a sensor package, the method comprising:
providing a carrier including electric conductors;
fastening a dummy die to the carrier;
providing an application specific integrated circuit (ASIC) device comprising an integrated sensor element; and
fastening the ASIC device to the dummy die,
wherein the dummy die is unstructured and electrically inactive,
wherein the ASIC device is fastened to the dummy die by an adhesive layer,
wherein the ASIC device laterally overhangs the dummy die,
wherein the sensor element is arranged on a portion of the ASIC device that laterally overhangs the dummy die,
wherein the adhesive layer directly adjoins the ASIC device, and
wherein the adhesive layer directly adjoins the dummy die.

12. The method according to claim 11, wherein a coefficient of thermal expansion of the dummy die is adapted to a coefficient of thermal expansion of the ASIC device.

13. The method according to claim 11, wherein the dummy die has smaller lateral dimensions than the ASIC device so that a lateral overhang is formed on at least one lateral side of the ASIC device.

14. A method for producing a sensor package, the method comprising:
providing a carrier including electric conductors;
fastening an interposer to the carrier;
providing an application specific integrated circuit (ASIC) device comprising an integrated sensor element; and
fastening the ASIC device to the interposer,
wherein the interposer is unstructured and electrically inactive,
wherein the ASIC device is fastened to the interposer by an adhesive layer,
wherein the ASIC device laterally overhangs the interposer,
wherein the sensor element is arranged on a portion of the ASIC device that laterally overhangs the interposer,
wherein the adhesive layer directly adjoins the ASIC device, and
wherein the adhesive layer directly adjoins the interposer.

15. The method according to claim 14, wherein a coefficient of thermal expansion of the interposer is adapted to a coefficient of thermal expansion of the ASIC device.

16. The method according to claim 14, wherein the interposer has smaller lateral dimensions than the ASIC device so that a lateral overhang is formed on at least one lateral side of the ASIC device.

* * * * *